(12) United States Patent
Jun

(10) Patent No.: US 9,193,624 B2
(45) Date of Patent: Nov. 24, 2015

(54) PRODUCTION METHOD FOR THERMOCHROMATIC GLASS IN WHICH USE IS MADE OF A LOW-TEMPERATURE METAL-VAPOUR-DEPOSITION PROCESS, AND THERMOCHROMATIC GLASS OBTAINED THEREBY

(75) Inventor: Youn Ki Jun, Gwacheon-si (KR)

(73) Assignee: LG HAUSYS, LTD., Seoul (KR)

( * ) Notice: Subject to any disclaimer, the term of this patent is extended or adjusted under 35 U.S.C. 154(b) by 0 days.

(21) Appl. No.: 14/234,797

(22) PCT Filed: Aug. 8, 2012

(86) PCT No.: PCT/KR2012/006275
§ 371 (c)(1),
(2), (4) Date: Jan. 24, 2014

(87) PCT Pub. No.: WO2013/025000
PCT Pub. Date: Feb. 21, 2013

(65) Prior Publication Data
US 2014/0170420 A1    Jun. 19, 2014

(30) Foreign Application Priority Data

Aug. 12, 2011 (KR) .................. 10-2011-0080816

(51) Int. Cl.
*C23C 14/00* (2006.01)
*C03C 17/34* (2006.01)
(Continued)

(52) U.S. Cl.
CPC ............. *C03C 17/3435* (2013.01); *C03C 17/27* (2013.01); *C03C 17/3411* (2013.01);
(Continued)

(58) Field of Classification Search
CPC .................................................... C23C 14/083
USPC .................................................. 204/192.26
See application file for complete search history.

(56) References Cited

U.S. PATENT DOCUMENTS 3,660,155 A * 5/1972 Mackenzie .................. 428/432
4,400,412 A   8/1983 Scanlon et al.
(Continued)

FOREIGN PATENT DOCUMENTS

CN   101560638 B  * 12/2010
CN   101910082 A    12/2010
(Continued)

OTHER PUBLICATIONS

International Search Report for PCT/KR2012/006275 mailed on Feb. 18, 2013.
(Continued)

*Primary Examiner* — Keith Hendricks
*Assistant Examiner* — Timon Wanga
(74) *Attorney, Agent, or Firm* — Hauptman Ham, LLP

(57) ABSTRACT

The present invention relates to a production method for thermochromatic glass in which use is made of a low-temperature metal vapor deposition process, and to thermochromatic glass obtained thereby. More specifically, the invention relates to: a production method for thermochromatic glass in which a low-temperature metal-vapor-deposition process is used in order to effect the vapor deposition of a metal for forming a thermochromatic metal oxide and then subsequently a heat treatment is carried out, such that the processing efficiency is high and the reliability of the thermochromatic characteristics of the glass produced by the method is outstanding; and to thermochromatic glass obtained by means of the method.

10 Claims, 6 Drawing Sheets

(51) Int. Cl.
C03C 17/27 (2006.01)
C23C 14/08 (2006.01)
C23C 14/34 (2006.01)

(52) U.S. Cl.
CPC ............ C03C17/3417 (2013.01); C23C 14/08 (2013.01); C23C 14/34 (2013.01); *C03C 2217/218* (2013.01); *C03C 2218/322* (2013.01)

(56) References Cited

U.S. PATENT DOCUMENTS

2002/0115306 A1* 8/2002 Won et al. .................. 438/781
2004/0005472 A1* 1/2004 Arnaud et al. ............... 428/472

FOREIGN PATENT DOCUMENTS

| JP | 5881976 A | 5/1983 |
| JP | 2696468 B2 | 1/1998 |
| JP | 2000137251 A | 5/2000 |
| JP | 2001048586 A | 2/2001 |
| JP | 2002086606 A | 3/2002 |
| JP | 2004313828 A | 11/2004 |
| JP | 2006206398 A | 8/2006 |
| JP | 2008297500 A | 12/2008 |
| KR | 1019960031660 A | 9/1996 |
| KR | 1020070081218 A | 8/2007 |
| WO | 2008009967 A1 | 1/2008 |

OTHER PUBLICATIONS

Litao Kang et al., A Novel Solution Process for the Synthesis of VO2 Thin Films with Excellent Thermochromic Properties, 8 pages, Research Center for Industrial Ceramics et al., Jul. 7, 2015.
Choong-Rae Cho et al., Current-induced metal-insulator transition in VOx thin film prepared by rapid-thermal-annealing, 2006, Thin Solid Films 495, pp. 375-379, Science Direct.
Zongtao Zhang et al., Effects of a TiO2 Buffer Layer on Solution-Deposited VO2 Films: Enhanced Oxidization Durability, 2010, pp. 22214-22220, 114, J. Phys. Chem. C.
Hongchen Wang et al., Fabrication of VO2 films with low transition temperature for optical switching applications, 2005, pp. 305-309, 256, Optics Communications.
Ping Jin et al., Formation and Thermochromism of VO2 Films Deposited by RF Magnetron Sputtering at Low Substrate Temperature, 1994, pp. 1478-1483, 33, Jpn. J. Appl. Phys.
Jianwei Ma et al., Vanadium dioxide thin films deposited on TiO2 buffer layer for smart thermochromic glazing of windows, 2012, pp. 1365-1368, 374-377, Advanced Materials Research.
Japanese Office Action dated Jan. 20, 2015.
European Search Reports dated Mar. 31, 2015.
Chinese Office Action dated Jul. 13, 2015 in connection with the counterpart Chinese Patent Application No. 201280039509.6.

* cited by examiner

PRODUCTION METHOD FOR THERMOCHROMATIC GLASS IN WHICH USE IS MADE OF A LOW-TEMPERATURE METAL-VAPOUR-DEPOSITION PROCESS, AND THERMOCHROMATIC GLASS OBTAINED THEREBY

CROSS REFERENCE TO RELATED APPLICATION

This application claims the priority of Korean Patent Application No. 10-2011-0080816 filed on Aug. 12, 2011 in the Korean Patent and Trademark Office. Further, this application is the National Phase application of International Application No. PCT/KR2012/006275 filed on Aug. 8, 2012, which is incorporated herein by reference in its entirety.

TECHNICAL FIELD

The present invention relates to a method of producing a thermochromatic glass through low-temperature metal vapor deposition and a thermochromatic glass produced by the same. More particularly, the present invention relates to a method of producing a thermochromatic glass, in which a metal for forming a thermochromatic metal oxide is deposited by metal vapor deposition at low temperature and then oxidized through heat treatment to thereby improve process efficiency and reliability of thermochromatic characteristics of the produced glass, and a thermochromatic glass produced by the same.

BACKGROUND ART

A thermochromatic glass has variable light transmittance depending upon ambient temperature, and decreases sunlight transmittance at high temperature to prevent external energy from being introduced into an interior, while increasing the sunlight transmittance at low temperature to promote introduction of external energy into the interior.

Thus, cooling load of a building is reduced at high temperature conditions, and heating load is reduced by a heating effect of natural lighting at low temperature conditions, thereby enabling efficient conservation of energy.

Such a thermochromatic glass is generally produced by coating a surface of glass with a thin film of vanadium dioxide ($VO_2$).

Vanadium dioxide has high light transmittance due to characteristics of a semiconductor having a monoclinic structure at low temperature, and is converted into an orthorhombic structure having metallic characteristics and decreases in light transmittance, as temperature increases.

However, vanadium is a transition metal and thus vanadium dioxide has various polymorphs such as $V_2O_3$, $V_2O_5$, $V_2O_7$, etc. Thus, it is important to achieve clear formation of a crystal phase of vanadium dioxide having thermochromatic characteristics at low temperature.

To this end, as disclosed in US Patent Publication No. 4,400,412 and International Publication No. WO2008/009967, chemical vapor deposition (CVD) using a gaseous metal precursor is typically used to smoothly form a thin film of vanadium dioxide among a plurality of polymorphs. In addition, it is necessary for this process to heat a glass substrate up to a temperature of 400° C. to 700° C. while depositing a thin film.

Sputtering is generally used in order to achieve stable production of a large-area coating glass for buildings.

However, since the coating glass for buildings using a large-area glass substrate employs continuous deposition using an in-line sputter, it is difficult to heat the glass substrate during deposition and sputtering is generally performed at low temperature. This is because heating of a large-area glass substrate having several tens of square meters can cause not only a technical problem in that the glass substrate can be broken by thermal shock, but also subordinate problems in that energy is excessively consumed and a large amount of carbon dioxide is emitted.

Such process difficulty limits commercialization of the thermochromatic glass.

Therefore, there is a need for a technique capable of clearly forming a crystal phase of vanadium dioxide while stably performing low-temperature metal vapor deposition without any problem.

DISCLOSURE

Technical Problem

An aspect of the present invention is to provide a method of producing a thermochromatic glass, in which a metal for forming a thermochromatic metal oxide is deposited by metal vapor deposition at low temperature and then oxidized through heat treatment to thereby improve process efficiency and reliability of thermochromatic characteristics of the produced glass, and a thermochromatic glass produced by the same.

Technical Solution

In accordance with one aspect of the present invention, a method of producing a thermochromatic glass includes: depositing a metal for forming a thermochromatic metal oxide on a glass substrate; and performing post-heat treatment of the glass substrate to form a crystal phase of the thermochromatic metal oxide through oxidation of the deposited metal.

In accordance with another aspect of the present invention, a method of producing a thermochromatic glass includes: forming an ion diffusion preventing film on a glass substrate; depositing a metal for forming a thermochromatic metal oxide on the ion diffusion preventing film; and performing post-heat treatment of the glass substrate to form a crystal phase of the thermochromatic metal oxide through oxidation of the deposited metal.

In accordance with a further aspect of the present invention, a thermochromatic glass includes: a glass substrate; an ion diffusion preventing film formed on the glass substrate; and a thermochromatic metal oxide film formed on the ion diffusion preventing film.

Advantageous Effects

According to the present invention, the method of producing a thermochromatic glass employs continuous deposition using an existing in-line sputter applied to a coating glass for buildings, thereby improving productivity.

In addition, according to the present invention, a thermochromatic glass has a clear crystal phase of vanadium dioxide, thereby improving reliability of thermochromatic characteristics.

BEST MODE

Figure 1:
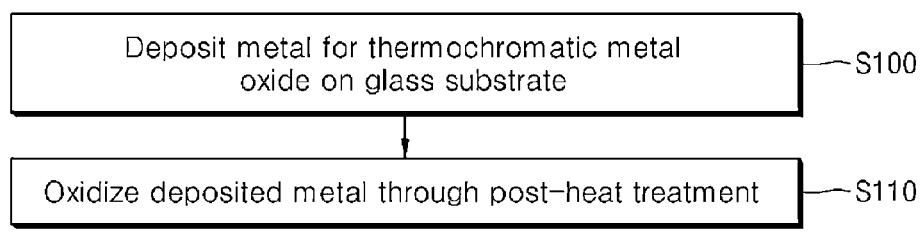
FIG. 1 shows a method of producing a thermochromatic glass according to one embodiment of the present invention.

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and thorough understanding of the present invention by those skilled in the art. The scope of the present invention is defined only by the claims. Like components will be denoted by like reference numerals throughout the specification.

Hereinafter, a method of producing a thermochromatic glass and a thermochromatic glass produced by the same according to embodiments of the invention will be described in more detail with reference to the accompanying drawings.

Referring to FIG. 1, a method of producing a thermochromatic glass according to one embodiment of the invention includes depositing a metal for forming a thermochromatic metal oxide on a glass substrate (S100); and performing post-heat treatment of the glass substrate to form a crystal phase of the thermochromatic metal oxide through oxidation of the deposited metal (S110).

In the method according to the embodiment of the invention, a metal for forming a thermochromatic metal oxide is first deposited on the glass substrate (S100).

The metal for forming a thermochromatic metal oxide refers to a metal before oxidization. In this embodiment, the metal may be vanadium.

The deposition process includes low-temperature sputtering or atomic layer deposition.

First, in sputtering, a gas ion (for example, argon ($Ar^+$)) accelerated within a chamber collides with a target having a negative voltage, and an ionized target material emitted by collision is deposited onto a desired substrate. In this embodiment, the metal (for example, vanadium) is deposited on the glass substrate by sputtering.

At this time, temperature for sputtering may be low within the range of 10° C. to 100° C. That is, no more cooling or heating may be applied to the temperature for general sputtering.

If the temperature is lower than this range, energy needed for movement of particles on the surface of the substrate is insufficient when the particles excited from the target by sputtering plasma are transferred to the substrate, whereby a thin film can be non-uniformly deposited onto the substrate. Further, temperature increased by plasma when sputtering is applied to the glass substrate having room temperature is generally lower than about 100° C. Therefore, in order to increase the temperature above 100° C., there is a need for an additional heater for heating a large-area glass substrate.

That is, a conventional technique has a problem in that it is not mechanically easy to uniformly heat a surface of a large-area glass substrate for buildings (for example, the maximum area of 3.3×6 m) to a desired temperature (for example, a temperature for forming a crystal phase of $VO_2$: 500° C.). However, according to the present invention, there is no need for an additional heating process.

According to one embodiment of the invention, a thin film of vanadium may be formed by atomic layer deposition. Like sputtering, atomic layer deposition is performed at low temperature, i.e. in the range of 10° C. to 100° C. By atomic layer deposition, the thin film can be formed to have excellent thickness uniformity.

Next, the glass substrate is subjected to post-heat treatment to form a crystal phase of a thermochromatic metal oxide through oxidation of the deposited metal (S110).

When post-heat treatment is applied to the glass substrate, the metal deposited on the substrate is oxidized to form the crystal phase of the thermochromatic metal oxide.

Here, the thermochromatic metal oxide is vanadium dioxide. At this time, temperature and time for post-heat treatment are very important to clearly form a crystal phase of vanadium dioxide among various polymorphs of vanadium dioxide. For example, post-heat treatment may be performed at a temperature of 460-480° C. for 360-600 seconds.

If the temperature of post-heat treatment is below this range, vanadium dioxide is not crystallized due to insufficient thermal energy for crystallization. On the other hand, if the temperature of post-heat treatment is above this range, additional thermochemical reaction occurs between oxygen in air and the thin film, thereby forming polymorphs containing an excess of oxygen.

Likewise, if the time for post-heat treatment is shorter than the foregoing range, vanadium dioxide is not crystallized due to insufficient supply of energy for crystallization. On the other hand, if the time for post-heat treatment is longer than the foregoing range, additional thermo-chemical reaction occurs between oxygen in air and the thin film as in the case where the temperature is higher than the foregoing range, thereby forming polymorphs containing an excess of oxygen.

Factors of determining a crystallized phase include a reaction temperature, time, atmosphere, etc. In general, if the temperature is low or the time for post-heat treatment is short, energy for crystallization becomes insufficient to thereby form another polymorph according to this condition. If the temperature is high or the time for post-heat treatment is long, a further polymorph according to this condition is formed.

In general, polymorphs formed at low and high temperatures are different from each other. However, according to the present invention, $V_2O_5$ is formed in common, as can be seen from the following examples. Here, in consideration of low peak intensity of grazing incident X-ray diffraction (GI- XRD), $V_2O_5$ formed at low temperature has low crystallinity and $V_2O_5$ formed at high temperature has high crystallinity.

Thus, it is considered that oxygen included in air for heat treatment additionally reacts with the thin film in the case of high temperature and long reaction time and forms $V_2O_5$ containing a larger amount of oxygen than $VO_2$. Accordingly, it is desirable that the method according to the embodiment of the invention satisfy the foregoing ranges of temperature and time.

Figure 2:
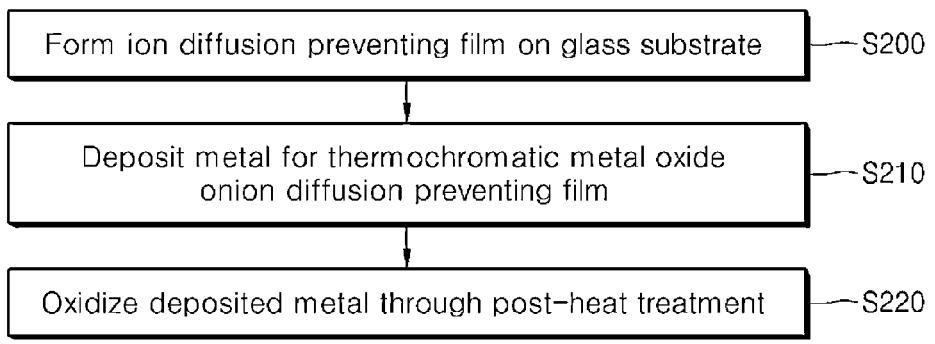
FIG. 2 shows a method of producing a thermochromatic glass according to another embodiment of the present invention.

As shown in FIG. 2, a method of producing a thermochromatic glass according to another embodiment of the invention includes forming an ion diffusion preventing film on a glass substrate (S200); depositing a metal for forming a thermochromatic metal oxide on the ion diffusion preventing film (S210); and performing post-heat treatment of the glass substrate to form a crystal phase of the thermochromatic metal oxide through oxidation of the deposited metal (S220).

Except for forming the ion diffusion preventing film on the glass substrate (S200) and depositing a metal for forming a thermochromatic metal oxide on the ion diffusion preventing film (S210), this method is the same as the method according to the above embodiment. Therefore, the ion diffusion preventing film will be described in more detail hereinafter.

The ion diffusion preventing film serves to prevent alkali metal ions contained in the glass substrate from being diffused and reacting with vanadium or vanadium oxide during post-heat treatment, thereby improving product reliability.

The ion diffusion preventing film may be a single layer of silicon nitride ($SiN_x$) or titanium dioxide ($TiO_2$), or a double-layer structure of silicon nitride ($SiN_x$) and titanium dioxide ($TiO_2$).

Silicon nitride and titanium dioxide prevent alkali metal ions contained in the glass substrate, in particular, sodium ions from being diffused during the post-heat treatment. To promote the effect of preventing diffusion of the ions, the double-layer structure of silicon nitride and titanium dioxide may be provided. Here, silicon nitride serves to prevent diffusion of sodium ions, and titanium dioxide serves to absorb a small amount of sodium ions so as to prevent the sodium ions from being transferred to a vanadium layer.

The ion diffusion preventing film may be formed by typical physical and chemical vapor deposition, without being limited thereto.

In the ion diffusion preventing film, silicon nitride may have a thickness of 10 nm to 40 nm, and titanium dioxide may have a thickness of 5 nm to 30 nm. If silicon nitride or titanium dioxide is formed to a smaller thickness than this range, it is difficult to prevent alkali ions from diffusing into the substrate. On the other hand, if silicon nitride or titanium dioxide is formed to a greater thickness than this range, there is a problem in that an additional configuration for the target material is needed to overcome a slow speed of sputtering.

That is, if the thickness of the ion diffusion preventing film is smaller than the foregoing range, diffusion of alkali ions $Na^+$ eluted from the lower glass substrate is not sufficiently prevented so that vanadium oxide containing $Na^+$ can be crystallized.

Further, if the thickness of the ion diffusion preventing film is thicker than the foregoing range, it is effective to prevent diffusion of ions, but there is a problem in that an additional target and a device for the additional target are needed to forma thick film using an in-line sputter since both silicon nitride and titanium dioxide have a slow sputtering deposition rate.

Figure 3:
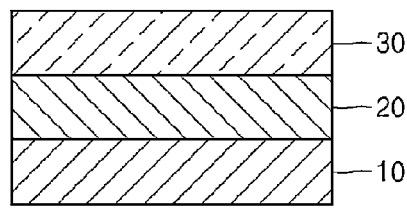
FIG. 3 shows a structure of a thermochromatic glass according to one embodiment of the present invention.

As shown in FIG. 3, a thermochromatic glass produced by the aforementioned method according to the present invention includes a glass substrate 10; an ion diffusion preventing film 20 formed on the glass substrate 10; and a thermochromatic metal oxide film 30 formed on the ion diffusion preventing film 20.

According to the present invention, the thermochromatic metal oxide 30 may be vanadium dioxide, and the ion diffusion preventing film 20 may have a single layer of silicon nitride or titanium dioxide or a double layer of silicon nitride and titanium dioxide. Detailed descriptions of these components are disclosed above in the description of the method, and thus will be omitted.

EXAMPLES

1. Production of Thermochromatic Glass (1) Example

A thin film of $SiN_x$ was deposited as a first diffusion preventing film on a soda lime glass having a thickness of 6 mm by reactive sputtering. Here, a process gas included 40 sccm (standard cubic centimeter per minute) of argon and 10 sccm of nitrogen, and processing pressure was fixed at 3 mTorr. Further, a power supply was AC power having a radio frequency of 13.56 MHz and a power density of 3.60 W/cm². Deposition was performed for 970 seconds.

A thin film of $TiO_2$ was deposited on the thin film of $SiN_x$ by sputtering. The process gas was 100 sccm of argon, the process pressure was 3 mTorr, the process power density was 4.50 W/cm², and deposition was performed for 480 seconds.

Vanadium was deposited on the thin film of $TiO_2$ by sputtering. At this time, the process gas was 100 sccm of argon, the process pressure was 3 mTorr, the process power density was 4.50 W/cm2, and deposition was performed for 244 seconds. Further, direct current (DC) power was used, and the overall deposition was performed at a low temperature of 25° C.

The prepared sample was heated to 470° C. for 1 minute in air by rapid heat treatment (thermal process), maintained for 9 minutes, and cooled in a furnace by nitrogen gas, thereby preparing a thermochromatic glass sample.

(2) Comparative Example 1

A soda-lime glass/vanadium structure was deposited to a thickness of 80 nm without an ion diffusion preventing layer, and subjected to post-heat treatment, thereby preparing a sample. Deposition of vanadium and post-heat treatment were performed in the same manner as in Example.

(3) Comparative Example 2

A sample was prepared in the same manner as in Example except that post-heat treatment was performed by heating the sample to 430° C. for 1 minute, followed by maintaining for 9 minutes.

(4) Comparative Example 3

A sample was prepared in the same manner as in Example except that post-heat treatment was performed by heating the sample to 450° C. for 1 minute, followed by maintaining for 9 minutes.

(5) Comparative Example 4

A sample was prepared in the same manner as in Example except that post-heat treatment was performed by heating the sample to 500° C. for 1 minute, followed by maintaining for 9 minutes.

(6) Comparative Example 5

A sample was prepared in the same manner as in Example except that post-heat treatment was performed by heating the sample to 470° C. for 1 minute, followed by maintaining for 3 minutes.

2. Transmittance Test According to Temperature

(1) Example

While the sample prepared in Example was heated by increasing ambient temperature from low temperature up to 100° C. and then cooled, variation in transmittance was observed in the sunlight region (i.e. a wavelength of 300 to 2100 nm). The observation results are shown in FIG. 4.

Figure 4:
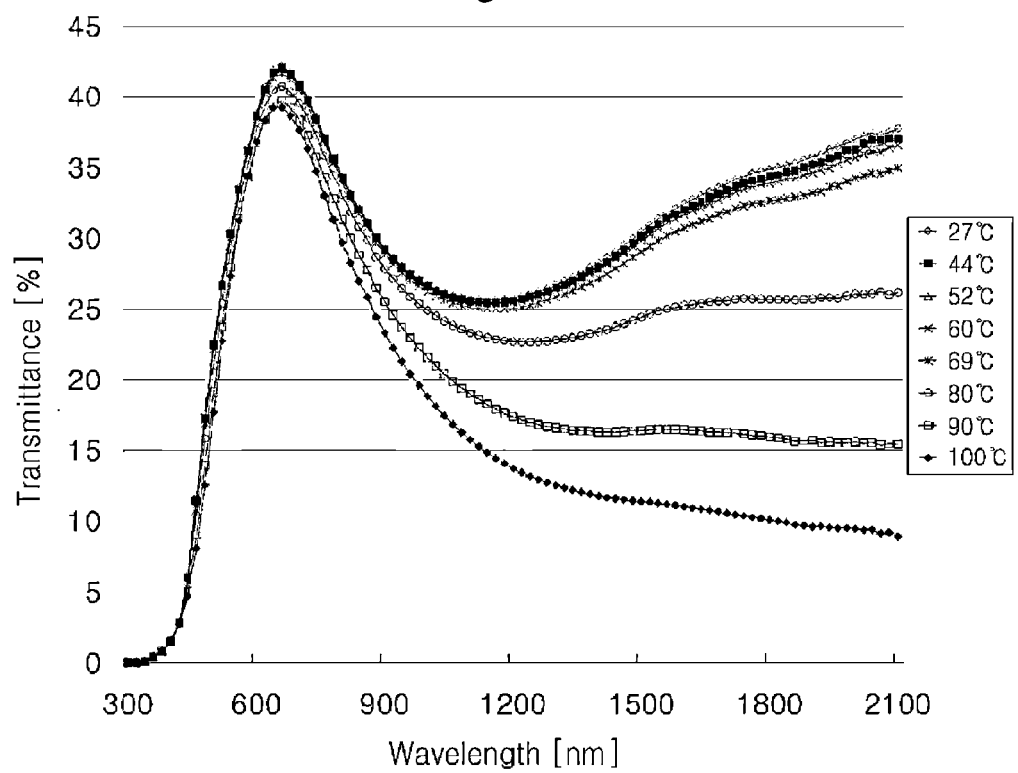
FIG. 4 is a graph showing transmittance varying depending upon temperature in a sunlight region (a wavelength region of 300 nm to 2100 nm) in a thermochromatic glass according to one example.

Referring to FIG. 4, it can be seen that transmittance varied in a near-infrared region (i.e. a wavelength of 780 to 2100 nm) depending upon change in temperature, and thus the thermochromatic characteristics were efficiently achieved. With this result, it can also be seen that the vanadium dioxide film was normally formed.

Figure 5:
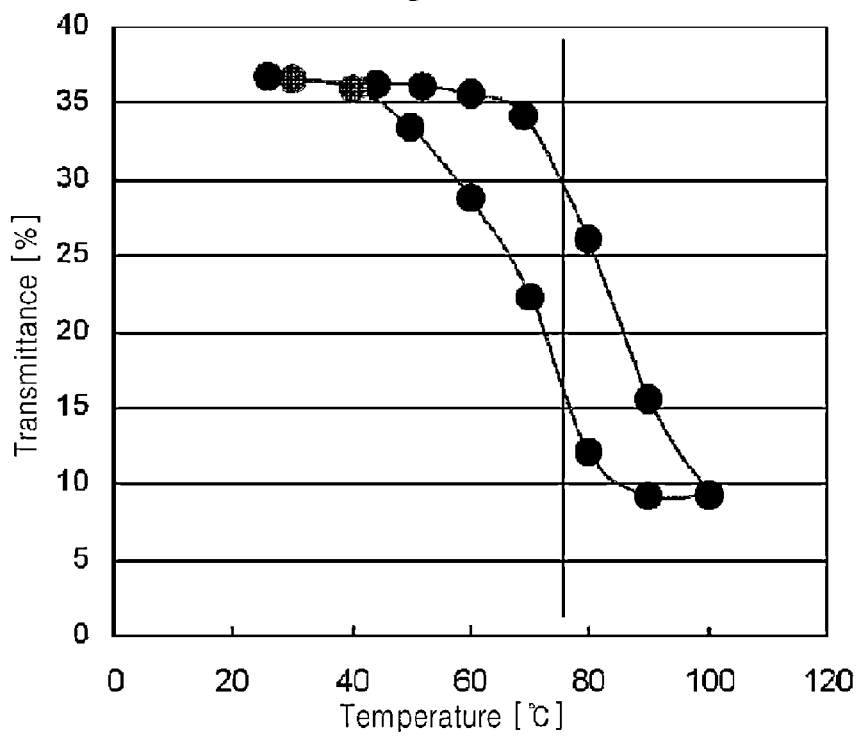
FIG. 5 is a graph showing transmittance varying depending upon temperature at 2000 nm in a thermochromatic glass according to one example.

To evaluate a chromatic temperature, variation in transmittance depending upon temperature at a wavelength of 2000 nm was observed. As a result, a transition temperature was determined at about 77° C., as shown in FIG. 5.

In addition, hysteresis due to heating and cooling was observed. As the temperature was changed, the lattice structure of the crystal phase of $VO_2$ was changed from a monoclinic crystal structure into an orthorhombic crystal structure. That is, it was understood that the hysteresis occurred since an additional temperature gradient was needed for transition of the remaining crystal.

(2) Comparative Example 4

Figure 6:
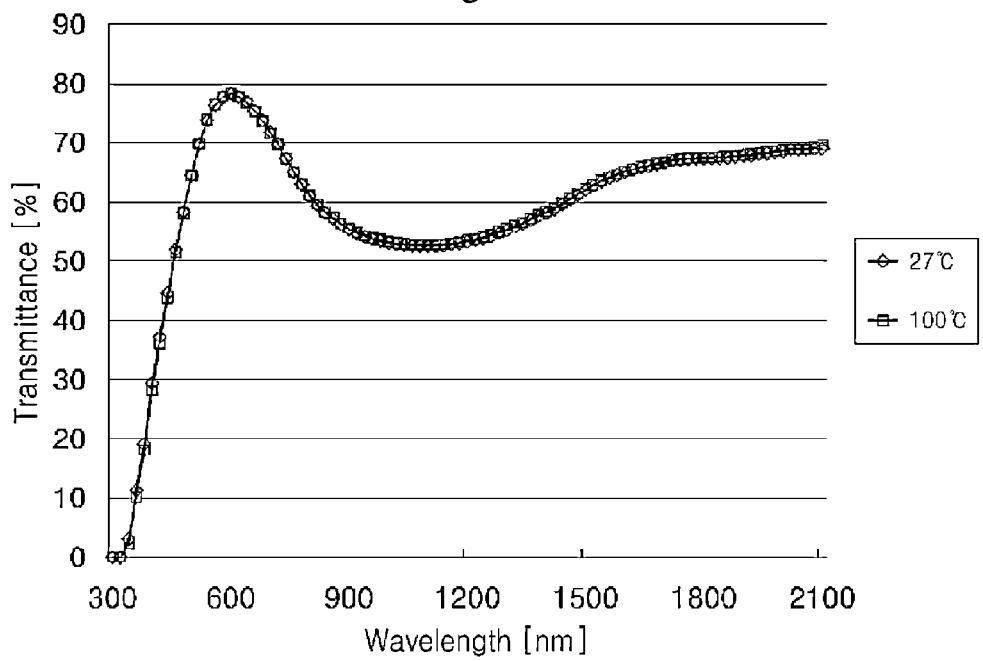
FIG. 6 is a graph showing transmittance varying depending upon temperature in a thermochromatic glass according to Comparative Example 4.

For the sample prepared in Comparative Example 4, variation in transmittance depending upon temperature was observed. As a result, there was no variation in transmittance depending upon ambient temperature, as shown in FIG. 6. With this result, it was indirectly understood that the vanadium dioxide film was not normally formed.

3. GI-XRD Testing

For the samples prepared in Comparative Examples 1 to 5, GI-XRD testing was performed as shown in FIGS. 8 to 11.

(1) Comparative Example 1

Figure 7:
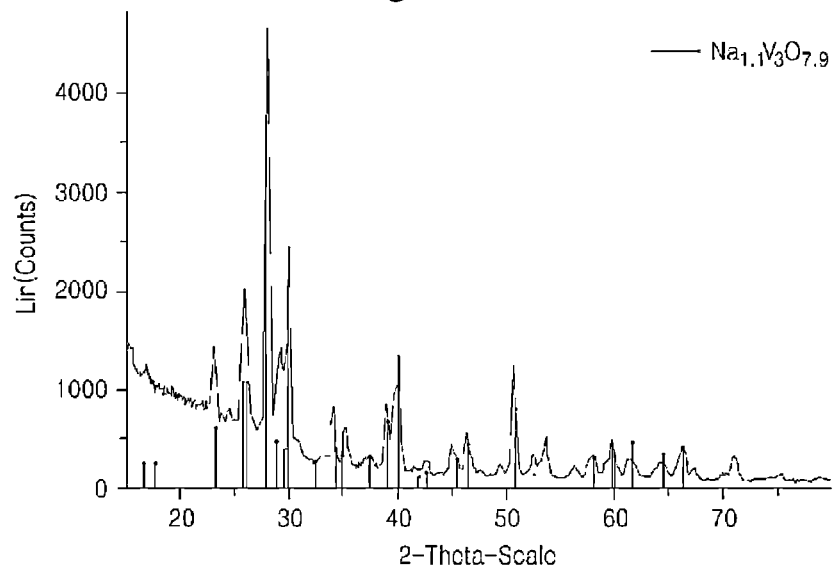
FIG. 7 is a grazing incident X-ray diffraction (GI-XRD) graph of the thermochromatic glass according to Comparative Example 1.

For Comparative Example 1, as a result of GI-XRD testing, it could be seen that a thin film of vanadium oxide ($Na_{1.1}V_3O_{7.9}$) containing sodium ions was formed, as shown in FIG. 7. It was understood that this result was caused by the absence of an ion-diffusion preventing film.

(2) Comparative Example 2, 3, 4

Figure 8:
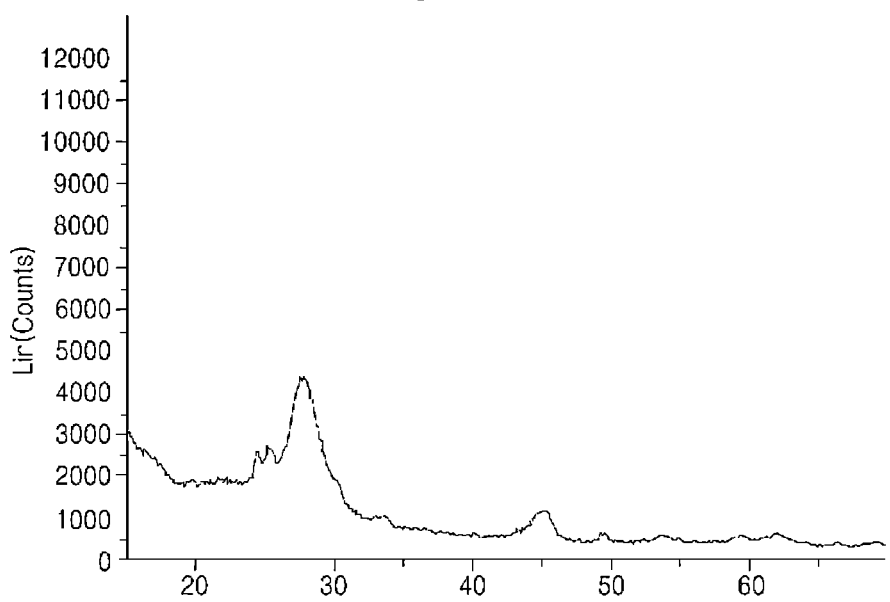
FIG. 8 is a GI-XRD graph of a thermochromatic glass according to Comparative Example 2.

For Comparative Example 2, as a result of GI-XRD testing, it could be seen that heating temperature was insufficient, since the unclear peaks of FIG. 8 showed that the crystal phase was not formed.

Figure 9:
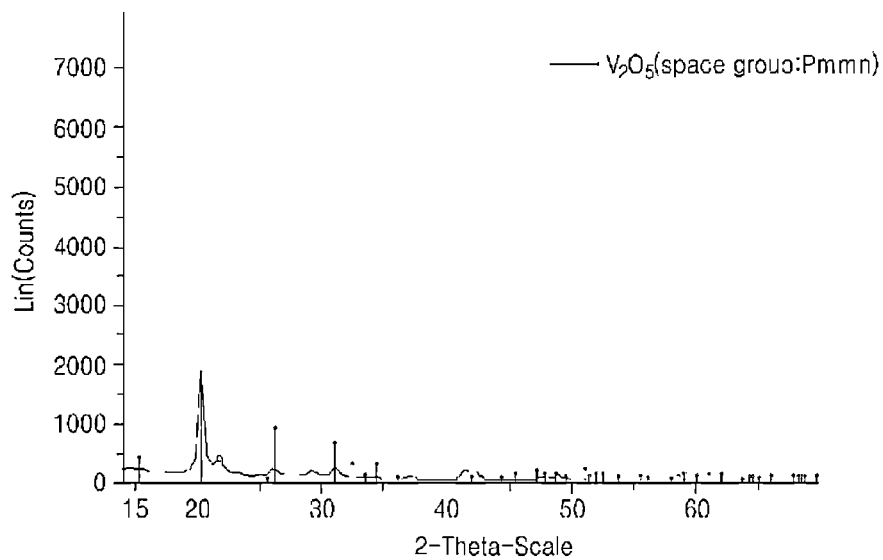
FIG. 9 is a GI-XRD graph of a thermochromatic glass according to Comparative Example 3.
Figure 10:
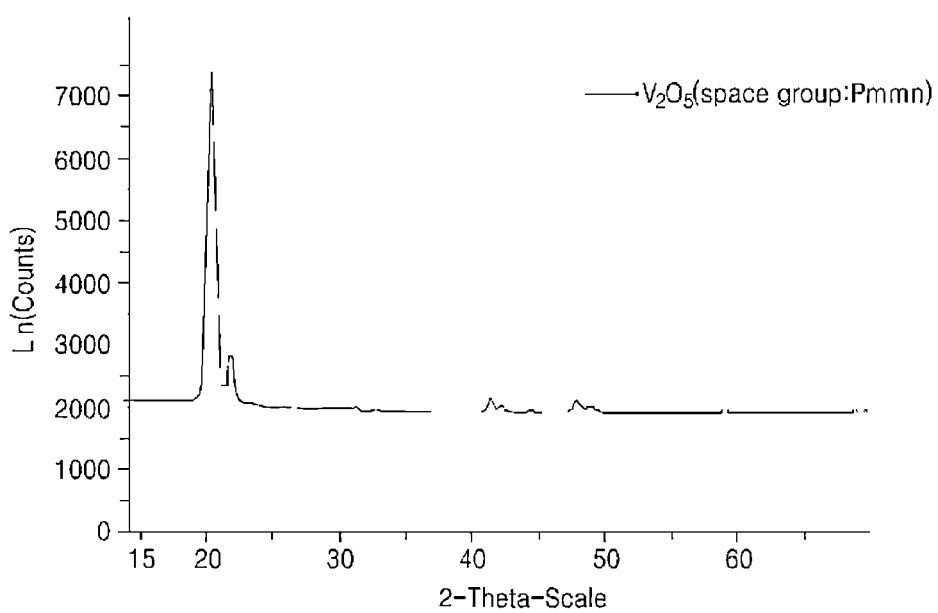
FIG. 10 is a GI-XRD graph of a thermochromatic glass according to Comparative Example 4.

In addition, for Comparative Examples 3 and 4, as a result of GI-XRD testing, it could be seen that $V_2O_5$ was formed as shown in FIGS. 9 and 10. It was understood that vanadium dioxide was not formed since the temperature conditions according to the present invention was not satisfied.

(3) Comparative Example 5

Figure 11:
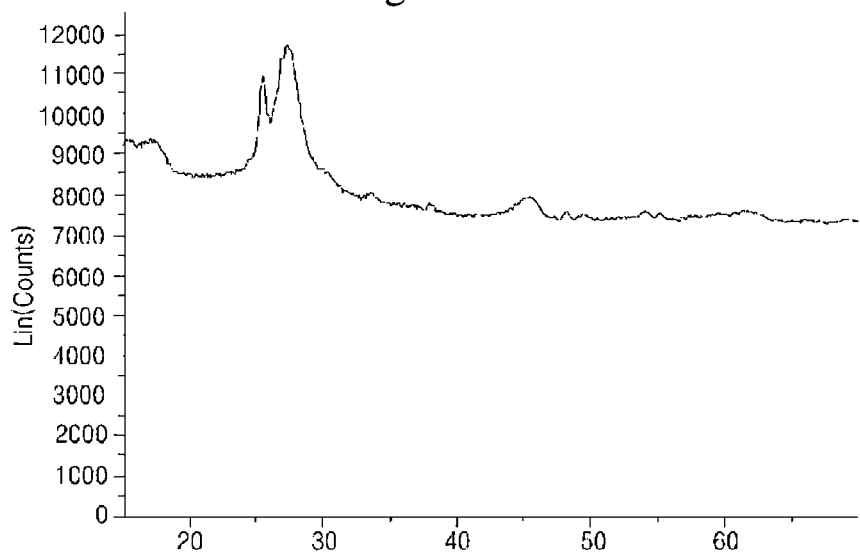
FIG. 11 is a GI-XRD graph of a thermochromatic glass according to Comparative Example 5.

For Comparative Example 5, as a result of GI-XRD testing, it could be seen that post-heat treatment was insufficient, since the unclear peaks of FIG. 11 showed that the crystal phase was not formed.

Although some embodiments have been described herein, it should be understood by those skilled in the art that these embodiments are given by way of illustration only, and that various modifications, variations, and alterations can be made without departing from the spirit and scope of the present invention. Accordingly, the scope of the present invention should be limited only by the accompanying claims and equivalents thereof.

The invention claimed is:

1. A method of producing a thermochromatic glass, comprising:
    depositing a metal for forming a thermochromatic metal oxide on a glass substrate; and
    performing post-heat treatment of the glass substrate to form a crystal phase of the thermochromatic metal oxide through oxidation of the deposited metal, wherein the post-heat treatment is performed at a temperature of 460° C. to 480° C., and wherein the post-heat treatment is performed for 360 to 600 seconds;
    wherein the metal for forming a thermochromatic metal oxide comprises vanadium (V); and
    wherein the crystal phase of the thermochromatic metal oxide comprises vanadium dioxide ($VO_2$).

2. A method of producing a thermochromatic glass, comprising:
    forming an ion diffusion preventing film on a glass substrate;
    depositing a metal for forming a thermochromatic metal oxide on the ion diffusion preventing film; and
    performing post-heat treatment of the glass substrate to form a crystal phase of the thermochromatic metal oxide through oxidation of the deposited metal, wherein the post-heat treatment is performed at a temperature of 460° C. to 480° C., and wherein the post-heat treatment is performed for 360 to 600 seconds;
    wherein the metal for forming a thermochromatic metal oxide comprises vanadium (V); and
    wherein the crystal phase of the thermochromatic metal oxide comprises vanadium dioxide ($VO_2$).

3. The method according to claim 1, wherein the metal for forming a thermochromatic metal oxide is deposited by sputtering or atomic layer deposition.

4. The method according to claim 1, wherein the metal for forming a thermochromatic metal oxide is deposited at a temperature of 10° C. to 100° C.

5. The method according to claim 2, wherein the ion diffusion preventing film comprises a single layer of silicon nitride ($SiN_x$) or titanium dioxide ($TiO_2$).

6. The method according to claim 2, wherein the ion diffusion preventing film comprises a double layer of silicon nitride ($SiN_x$) and titanium dioxide ($TiO_2$).

7. The method according to claim 2, wherein the metal for forming a thermochromatic metal oxide consists essentially of vanadium (V); and wherein the crystal phase of the thermochromatic metal oxide consists essentially of vanadium dioxide ($VO_2$).

8. The method according to claim 2, wherein the metal for forming a thermochromatic metal oxide consists of vanadium (V); and wherein the crystal phase of the thermochromatic metal oxide consists of vanadium dioxide ($VO_2$).

9. The method according to claim 1, wherein the metal for forming a thermochromatic metal oxide consists essentially of vanadium (V); and wherein the crystal phase of the thermochromatic metal oxide consists essentially of vanadium dioxide ($VO_2$).

10. The method according to claim 1, wherein the metal for forming a thermochromatic metal oxide consists of vanadium (V); and wherein the crystal phase of the thermochromatic metal oxide consists of vanadium dioxide ($VO_2$).

\* \* \* \* \*